United States Patent
Block et al.

(10) Patent No.: US 8,078,926 B2
(45) Date of Patent: Dec. 13, 2011

(54) TEST PIN GATING FOR DYNAMIC OPTIMIZATION

(75) Inventors: Stefan G. Block, Munich (DE); Herbert Preuthen, Dorfen (DE); Farid Labib, Dießen (DE); Stephan Habel, Berg (DE); Claus Pribbernow, Munich (DE)

(73) Assignee: LSI Corporation, Milpitas, CA (US)

( * ) Notice: Subject to any disclaimer, the term of this patent is extended or adjusted under 35 U.S.C. 154(b) by 123 days.

(21) Appl. No.: 12/558,611

(22) Filed: Sep. 14, 2009

(65) Prior Publication Data

US 2011/0066905 A1   Mar. 17, 2011

(51) Int. Cl.
*G01R 31/28* (2006.01)
(52) U.S. Cl. ......... 714/727; 714/729
(58) Field of Classification Search .......... 331/57; 714/30, 724, 731, 733, 726, 727, 729
See application file for complete search history.

(56) References Cited

U.S. PATENT DOCUMENTS

| | | | |
|---|---|---|---|
| 4,819,166 A * | 4/1989 | Si et al. | 714/30 |
| 5,912,900 A * | 6/1999 | Durham et al. | 714/724 |
| 6,295,621 B1 * | 9/2001 | Erhart et al. | 714/724 |
| 7,482,886 B1 * | 1/2009 | Kingsley | 331/57 |
| 7,650,548 B2 * | 1/2010 | Block et al. | 714/726 |
| 7,870,452 B2 * | 1/2011 | Souef et al. | 714/731 |
| 2003/0094631 A1 * | 5/2003 | Akram et al. | 257/200 |
| 2006/0146484 A1 * | 7/2006 | Kim et al. | 361/600 |

* cited by examiner

*Primary Examiner* — David Ton
(74) *Attorney, Agent, or Firm* — Luedeka, Neely & Graham, P.C.

(57) ABSTRACT

An improvement to an integrated circuit of a type having a test enable line for enabling an electrical test of the integrated circuit only when the test enable line is at a logical high value, and output lines that are only used during the electrical test of the integrated circuit, where the improvement is a switch circuit for disabling a state change in the output lines when the test enable line is at a logical low value. In this manner, the output lines do not switch during functional use of the integrated circuit, and cannot be aggressors on the data signals that are carried by the data lines that are used during the functional use of the integrated circuit. In addition, these non-switching output lines can act as guard traces that run between the data lines, further electrically isolating the data lines from one another. Further, because they do not switch during functional use of the integrated circuit, the overall power consumption of the integrated circuit is reduced.

6 Claims, 3 Drawing Sheets

TEST PIN GATING FOR DYNAMIC OPTIMIZATION

FIELD

This invention relates to the field of integrated circuits. More particularly, this invention relates to integrated circuit designs that disable test nets such as during functional operation of the integrated circuit.

BACKGROUND

Modern integrated circuits include ever-increasing numbers of functional elements, which drive an increase in the amount of time required to test the integrated circuits. These more complex integrated circuits also have a higher leakage power-consumption than their less complex counterparts. As the number of elements within the circuit expands, the individual size of the elements tends to decrease and the space between adjacent elements also decreases, and thus these new technologies are more sensitive to crosstalk.

To address these challenges, new test methodologies like scan test compression are used. The use of such methodologies changes the structure of the integrated circuits designs by adding electrically conductive traces and components that are only used during the testing of the integrated circuit, and are not a part of the functional circuitry that is employed to accomplish the purpose of the integrated circuit. In other words, this testing circuitry is never used once the testing of the integrated circuit is completed and the integrated circuit is placed into operational or functional use.

Thus, modern integrated circuit designs have many thousands of these short scan test chains. To control the complexity and the test tool run times, more and more designs use a hierarchical layout, commonly referred to as hard macros. This implementation of short scan chains in a hierarchical design results in the hard macros having hundreds and even thousands of test pins. These pins have no functionality during normal operation of the device, but they nevertheless can toggle during normal operation of the integrated circuit, which results in dynamic power consumption and crosstalk issues when the toggling scan port acts as an crosstalk aggressor for a functional net.

FIG. 1 depicts a prior art example of such a situation. The net SCANOUT123 is driving a scan net outside the HM1 circuit, and is only used for testing purposes, not for functional use of the integrated circuit. However, when the driving flip flop changes state, dynamic power is consumed by the test net. In addition, the SCANOUT 123 net is routed close to the nets DOUT1 and DOUT2, so the switching of SCANOUT123 can act as an aggressor net on the DOUT1 and the DOUT2 data signals.

What is needed, therefore, is a design that overcomes problems such as those described above, at least in part.

SUMMARY

The above and other needs are met by an improvement to an integrated circuit of a type having a test enable line for enabling an electrical test of the integrated circuit only when the test enable line is at a logical high value, and output lines that are only used during the electrical test of the integrated circuit, where the improvement is a switch circuit for disabling a state change in the output lines when the test enable line is at a logical low value.

In this manner, the output lines do not switch during functional use of the integrated circuit, and cannot be aggressors on the data signals that are carried by the data lines that are used during the functional use of the integrated circuit. In addition, these non-switching output lines can act as guard traces that run between the data lines, further electrically isolating the data lines from one another. Further, because they do not switch during functional use of the integrated circuit, the overall power dynamic consumption of the integrated circuit is reduced.

In various embodiments according to this aspect of the invention, the switch circuit is an AND gate or a latch. In some embodiments the integrated circuit is a memory circuit and the test enable line is a membist line.

According to another aspect of the invention there is described an improvement to a flip flop within an integrated circuit, where the flip flop has an output line, where the improvement in the flip flop is an input for a test enable line and an additional AND gate for receiving as inputs the test enable line and the output line and having as an output a scan out line, the AND gate for disabling a state change in the scan out line when the test enable line is at a logical low value.

According to yet another aspect of the invention there is described a method of electrically guarding adjacent data lines of an integrated circuit, by placing a scan out test line between the adjacent data lines, where the scan out test line is used only during testing of the integrated circuit and not during functional use of the integrated circuit, and holding the scan out test line at a constant logical low state during functional use of the integrated circuit, thereby electrically guarding the adjacent data lines of the integrated circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
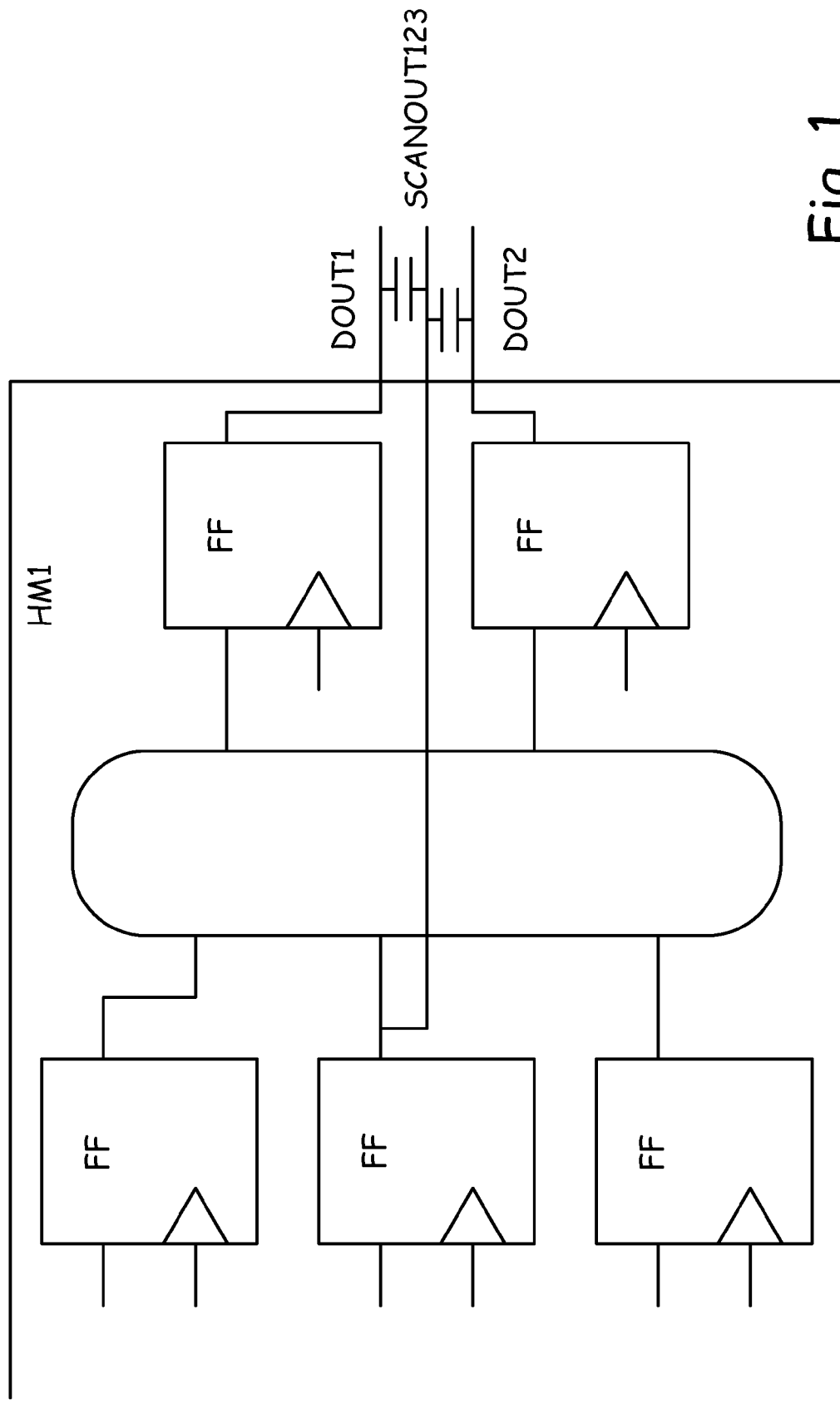
FIG. 1 is a prior art depiction of a portion of an integrated circuit.
Figure 2:
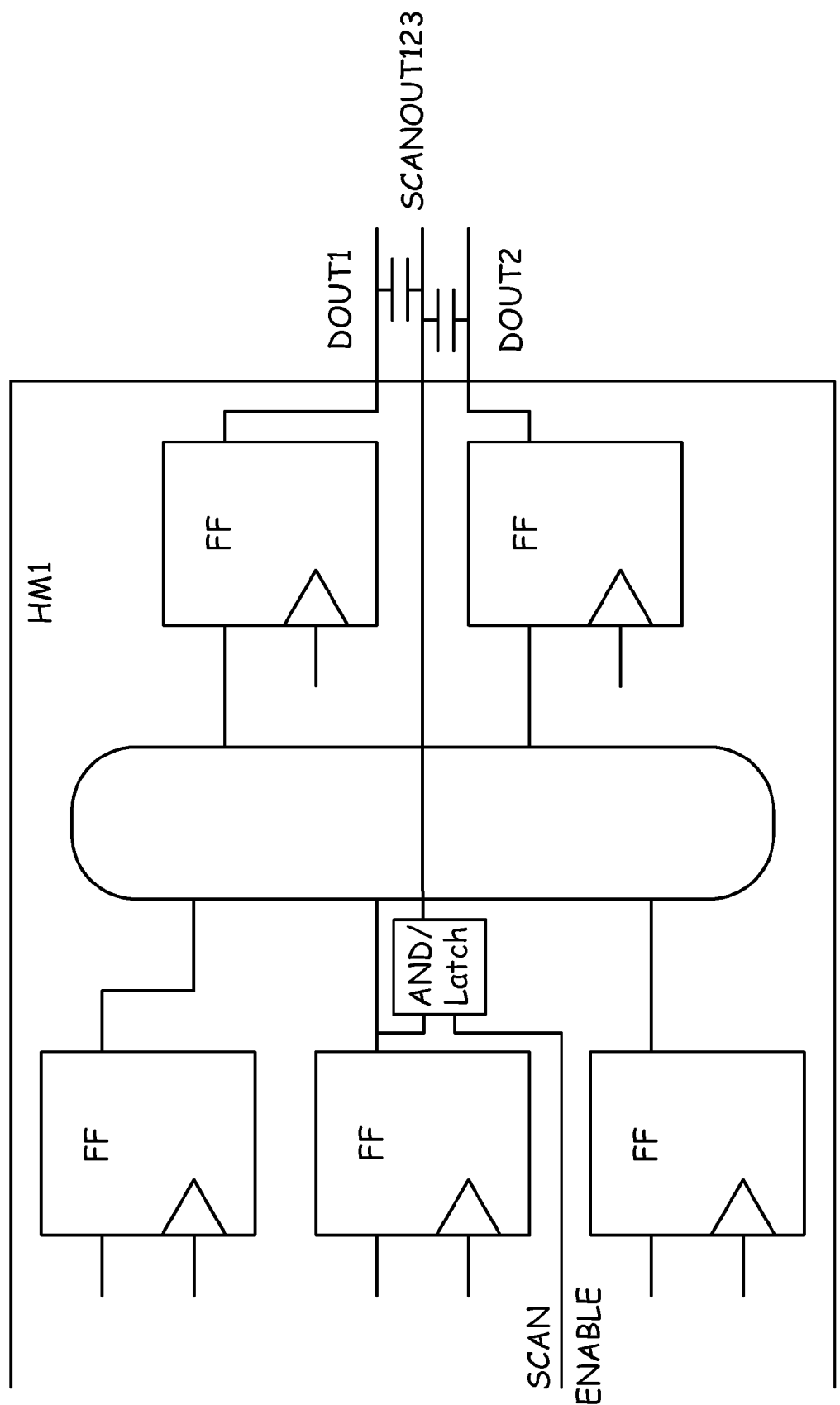
FIG. 2 is an integrated circuit according to FIG. 1 that has been modified according to an embodiment of the present invention.

FIG. 2 depicts one embodiment of the present invention, where the circuit of FIG. 1 has been modified with an AND gate to gate the SCANOUT123 (test) signals by routing the scan-enable signal into the HM1 circuit. When the integrated circuit is operated in the functional mode, the scan-enable line is at a logical low. Thus, the SCANOUT123 will not toggle, and will not consume any power or produce any cross-talk on the data lines, and cannot victimize the data signals. Further, because SCANOUT123 is at a constant low, it behaves like a shield for the data signals.

Instead of using an AND gate for the gating of the SCANOUT123, a latch can be used. This would ensure that the SCANOUT123 does not switch from the old state to 0 in case the scan-enable line goes low. This would keep the old state of the scan out as long as the scan-enable is low. The stable SCANOUT net also helps to reduce the testing tool run times, as fewer switching nets mean fewer timing windows during cross-talk analysis, and fewer timing windows and fewer potential aggressors mean reduced testing tool run times.

Figure 3:
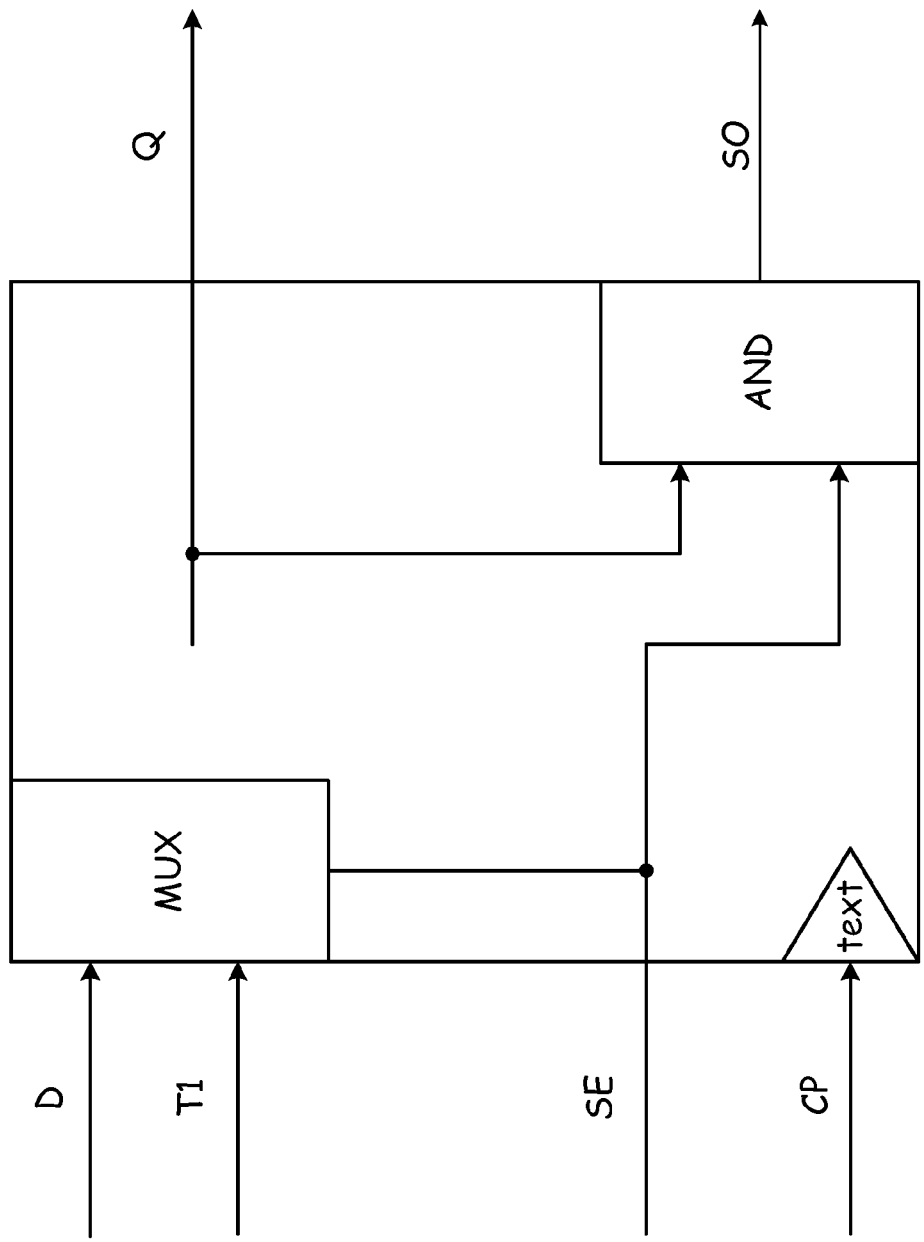
FIG. 3 is a schematic of a flip flop that is modified according to an embodiment of the present invention.

The power and cross talk reduction can be even greater if not only the scan pins at the hard macro boundary get gated with the scan enable signal, but also if all the scan nets are gated. For this to occur, a change in the flip flop architecture can be implemented, as depicted in FIG. 3. In this embodiment, the flip flop is modified to have a separate scan out pin that is gated inside the flip flop with the scan enable line. Other embodiments of the present are applicable to cells that are used for other types of test signals in hard macros that are only active during a certain mode of the device testing.

Because the scan out of the flip flop is not timing critical, the scan out output of the flip flop has a low drive strength and a high voltage threshold buffer, to keep the leakage low. However, the Q output of the flip flop can have different characteristics in different embodiments, such as different drive strengths and different voltage thresholds.

In another embodiment, the built-in-self-test logic for a memory circuit is gated. This logic has a clearly defined control signal, which is typically referred to as the membist signal. According to the present invention, this signal is used to gate the outputs and inputs of the memory BIST module, as well as to gate the clock of that module. By so doing, a dynamic power reduction for the module is achieved when in the functional (non-test) mode. In addition, none of the nets of the module can be a crosstalk victimizer, because all of the nets of the test module are stabilized.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In an integrated circuit of a type having a test enable line for enabling an electrical test of the integrated circuit only when the test enable line is at a logical high value, and output lines that are only used during the electrical test of the integrated circuit, the improvement comprising a switch circuit for disabling a state change in the output lines when the test enable line is at a logical low value.

2. The integrated circuit of claim 1, wherein the switch circuit is an AND gate.

3. The integrated circuit of claim 1, wherein the switch circuit is a latch.

4. The integrated circuit of claim 1, wherein the integrated circuit is a memory circuit and the test enable line is a membist line.

5. In a flip flop within an integrated circuit, where the flip flop has an output line, the improvement in the flip flop comprising an input for a test enable line and an additional AND gate for receiving as inputs the test enable line and the output line and having as an output a scan out line, the AND gate for disabling a state change in the scan out line when the test enable line is at a logical low value.

6. A method of electrically guarding adjacent data lines of an integrated circuit, the method comprising the steps of:
   placing a scan out test line between the adjacent data lines, where the scan out test line is used only during testing of the integrated circuit and not during functional use of the integrated circuit, and
   holding the scan out test line at a constant logical low state during functional use of the integrated circuit, thereby electrically guarding the adjacent data lines of the integrated circuit.

* * * * *